United States Patent
Nagasawa et al.

(10) Patent No.: US 12,166,478 B2
(45) Date of Patent: Dec. 10, 2024

(54) SEMICONDUCTOR INTEGRATED CIRCUIT

(71) Applicants: Kabushiki Kaisha Toshiba, Tokyo (JP); Toshiba Electronic Devices & Storage Corporation, Tokyo (JP)

(72) Inventors: Toshio Nagasawa, Takasaki Gumma (JP); Naotaka Koide, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 18/117,515

(22) Filed: Mar. 6, 2023

(65) Prior Publication Data

US 2023/0421153 A1    Dec. 28, 2023

(30) Foreign Application Priority Data

Jun. 23, 2022    (JP) .................................. 2022-101349

(51) Int. Cl.

| | |
|---|---|
| *H03K 17/687* | (2006.01) |
| *G01R 25/00* | (2006.01) |
| *H02J 1/10* | (2006.01) |
| *H03K 5/24* | (2006.01) |
| *H03K 17/00* | (2006.01) |

(52) U.S. Cl.
CPC ....... *H03K 17/6874* (2013.01); *G01R 25/005* (2013.01); *H02J 1/10* (2013.01); *H03K 5/24* (2013.01); *H03K 17/002* (2013.01)

(58) Field of Classification Search
CPC .......... H03K 5/22; H03K 5/24; H03K 5/2472; H03K 17/002; H03K 17/005; H03K 17/302; H03K 17/08; H03K 17/16; H03K 17/161; H03K 17/687; H03K 17/6871; H03K 17/6872; H03K 17/6874; H03K 17/693; G01R 25/005; G01R 19/0038; G01R 19/16566; G01R 19/16571; G01R 19/16576; H02J 1/10
See application file for complete search history.

(56) References Cited

U.S. PATENT DOCUMENTS

| | | | |
|---|---|---|---|
| 11,418,182 B2 * | 8/2022 | Hayashi | ............ H03K 17/0822 |
| 2017/0214313 A1 | 7/2017 | Kikuchi | |
| 2019/0036521 A1 * | 1/2019 | Wu | ......................... H03K 5/24 |

FOREIGN PATENT DOCUMENTS

| | | |
|---|---|---|
| JP | 2015-115173 A | 6/2015 |
| JP | 2021-164270 A | 10/2021 |
| WO | 2015/182669 A1 | 12/2015 |

* cited by examiner

*Primary Examiner* — Long Nguyen
(74) *Attorney, Agent, or Firm* — Kim & Stewart LLP

(57) ABSTRACT

According to one embodiment, semiconductor integrated circuit includes a first switch circuit, a second switch circuit, a correction circuit and a comparison circuit. The first switch circuit is configured to output or interrupt a first voltage in accordance with a first signal. The second switch circuit is configured to output or interrupt a second voltage in accordance with a second signal. The correction circuit is configured to correct the second signal and output a third signal. The comparison circuit is configured to compare the third signal output from the correction circuit with the first voltage and determine the first signal based on a result of comparison.

16 Claims, 10 Drawing Sheets

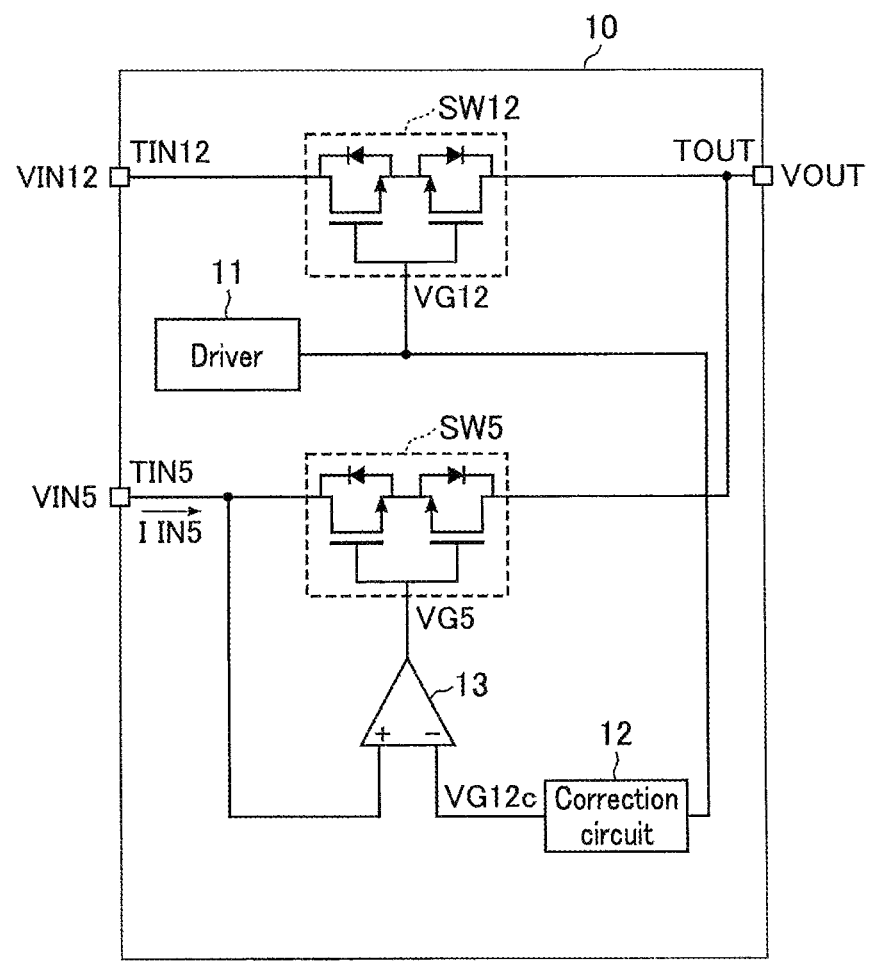
F I G. 1

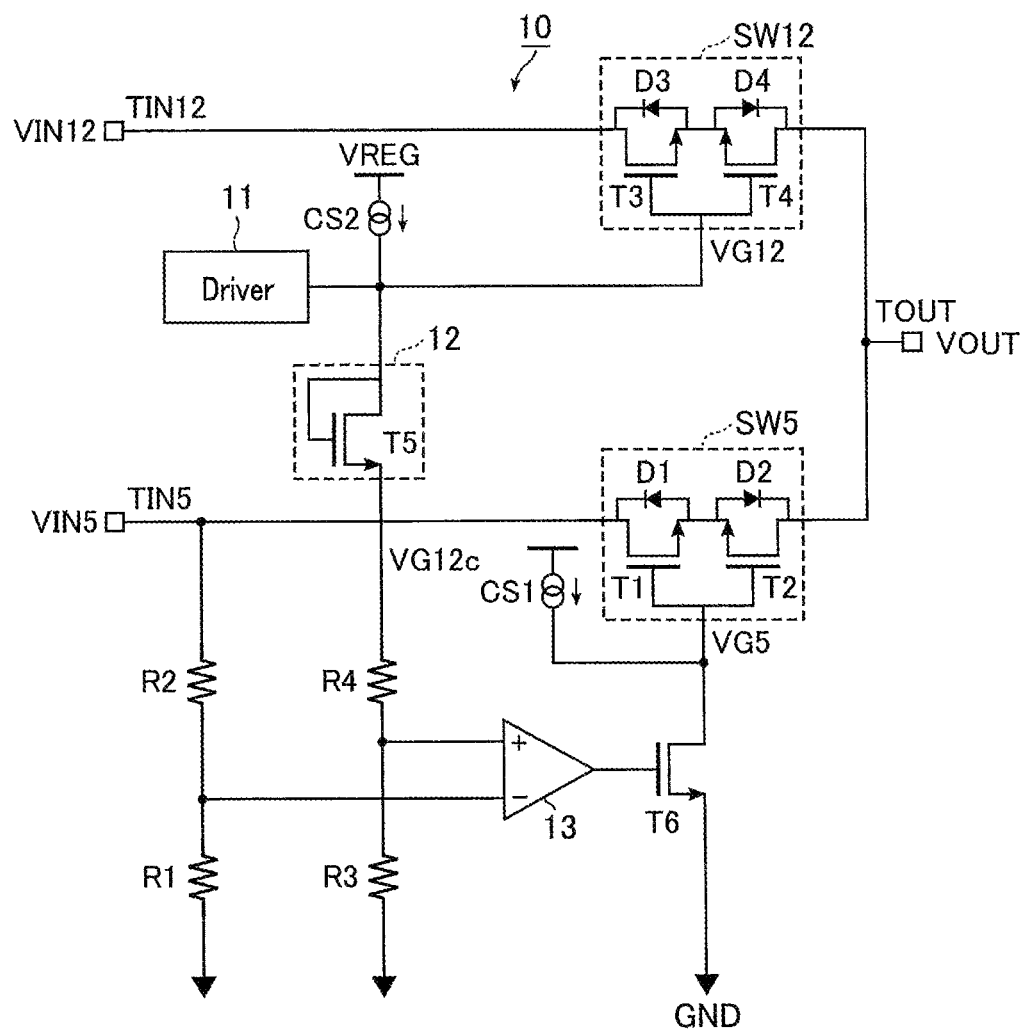
F I G. 3

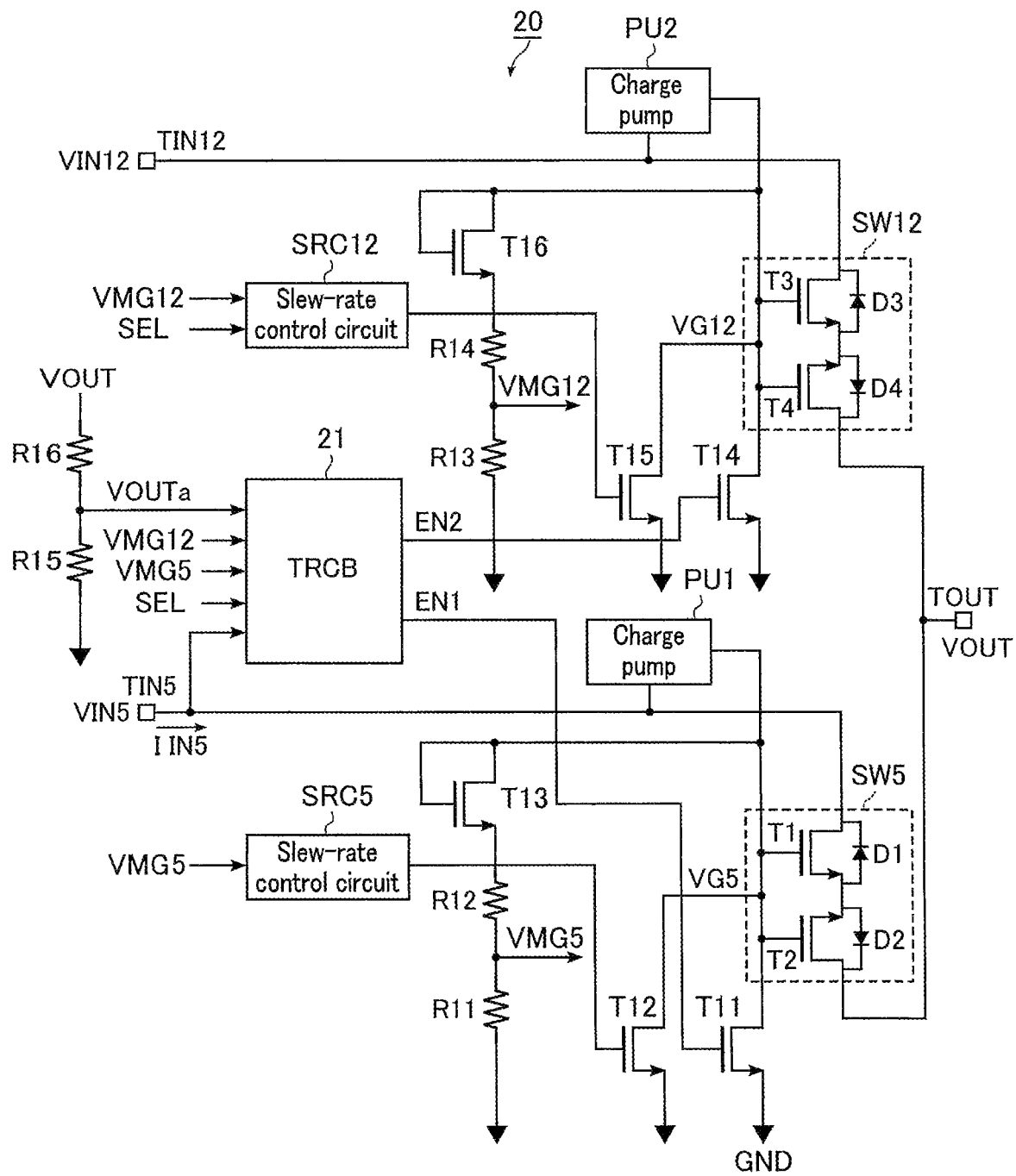
F I G. 4

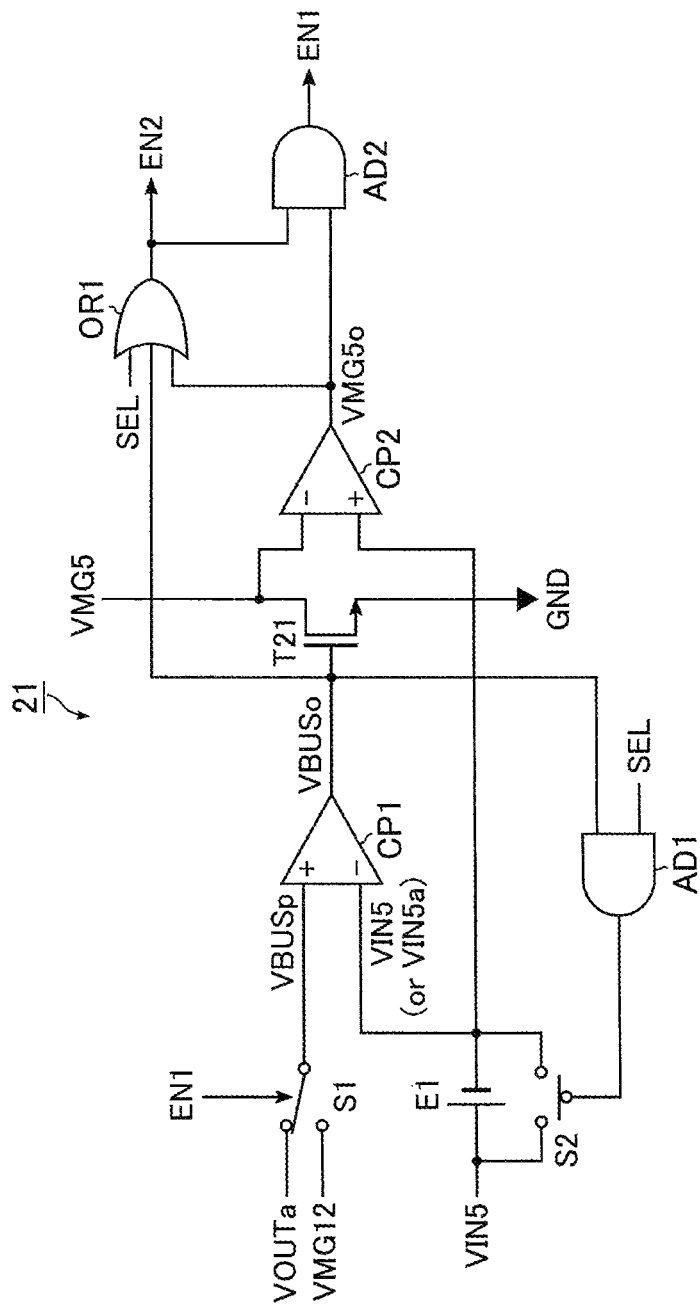
F I G. 5

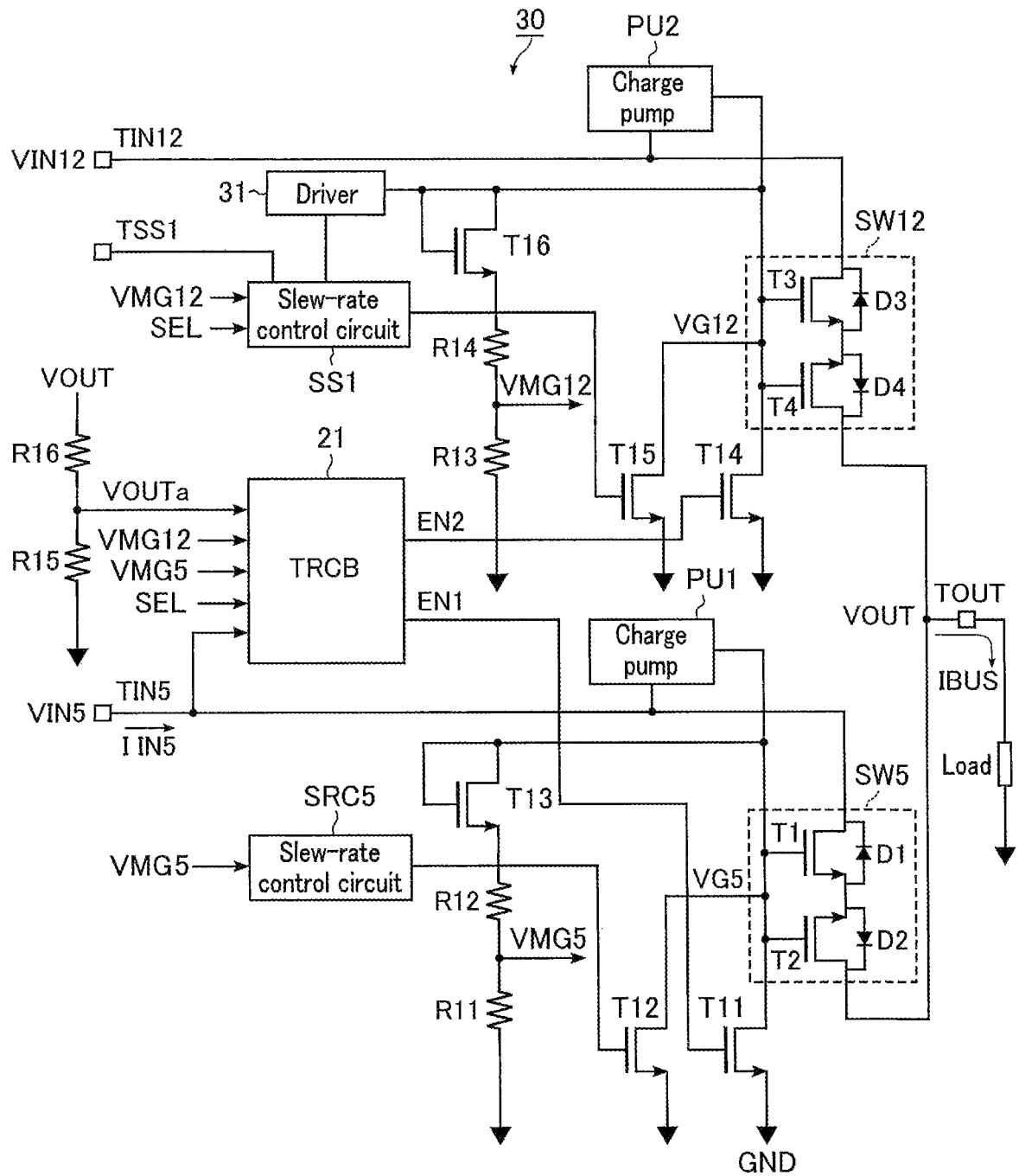
F I G. 8

US 12,166,478 B2

SEMICONDUCTOR INTEGRATED CIRCUIT

CROSS-REFERENCE TO RELATED APPLICATIONS

This application is based upon and claims the benefit of priority from Japanese Patent Application No. 2022-101349, filed Jun. 23, 2022, the entire contents of which are incorporated herein by reference.

FIELD

Embodiments described herein relate generally to a semiconductor integrated circuit.

BACKGROUND

Power control circuits for outputting an input voltage or interrupting the input voltage, such as electronic fuses and load switches, have been known.

BRIEF DESCRIPTION OF THE DRAWINGS

FIG. 1 is a circuit diagram illustrating an overview of a semiconductor integrated circuit according to a first embodiment.

FIG. 3 is a circuit diagram illustrating a configuration of the semiconductor integrated circuit according to the first embodiment.

FIG. 4 is a circuit diagram illustrating a configuration of a semiconductor integrated circuit according to a second embodiment.

FIG. 5 is a circuit diagram illustrating a configuration of a TRCB 21 in the semiconductor integrated circuit according to the second embodiment.

FIG. 8 is a circuit diagram illustrating a configuration of a semiconductor integrated circuit according to a third embodiment.

DETAILED DESCRIPTION

Figure 2:
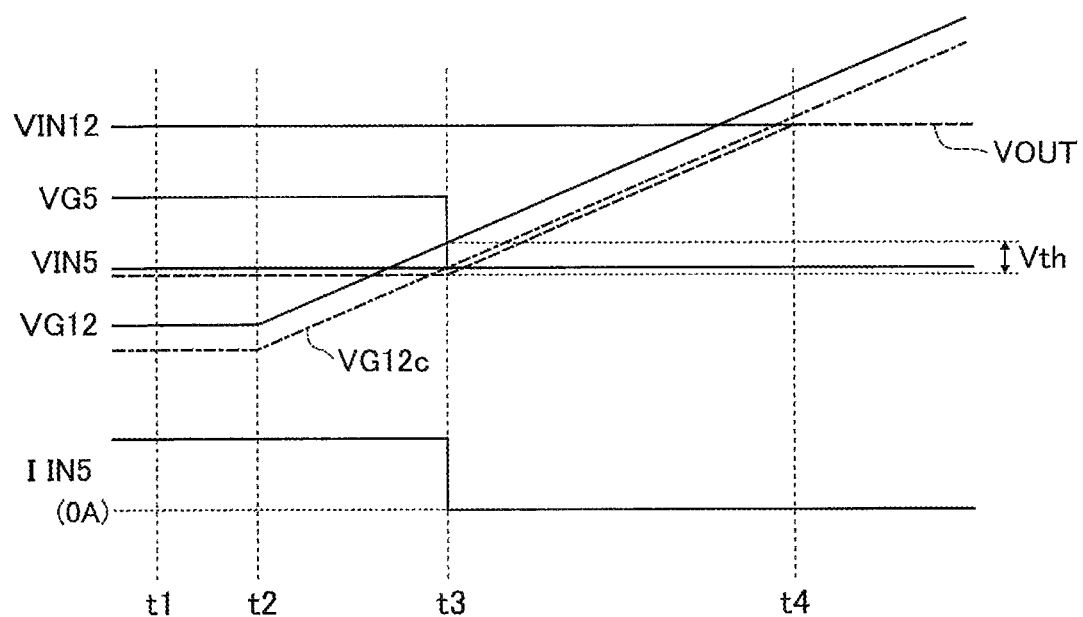
FIG. 2 is a timing chart showing operations of the semiconductor integrated circuit according to the first embodiment.

In general, according to one embodiment, the semiconductor integrated circuit includes a first switch circuit configured to output or interrupt a first voltage in accordance with a first signal; a second switch circuit configured to output or interrupt a second voltage in accordance with a second signal; a correction circuit configured to correct the second signal and output a third signal; and a comparison circuit configured to compare the third signal output from the correction circuit with the first voltage and determine the first signal based on a result of comparison.

In the following description, the same reference numerals are assigned to structural components having the same functions and structures. The embodiments described below are presented merely to show exemplary devices and methods that embody the technical concepts of the embodiments, and therefore the materials, forms, structures and arrangements of the structural components are not limited to the ones described below.

The embodiments will be explained below with reference to the drawings. The semiconductor integrated circuit according to the embodiments may include an electronic fuse. Such a semiconductor integrated circuit may be used for a system, such as a mobile terminal and a portable information device, capable of switching multiple power supplies.

1. First Embodiment

First, an overview of a semiconductor integrated circuit according to a first embodiment will be described. FIG. 1 is a circuit diagram illustrating the overview of the semiconductor integrated circuit according to the first embodiment.

As illustrated in FIG. 1, a semiconductor integrated circuit 10 includes switch circuits SW5 and SW12, a driver 11, a correction circuit 12, a comparison circuit including, for example, a comparator 13, input terminals TIN5 and TIN12, and an output terminal TOUT. An input voltage VIN5 is input to the input terminal TIN5, and an input voltage VIN12 is input to the input terminal TIN12. The input voltage VIN12 has a voltage value that differs from that of the input voltage VIN5. For instance, the input voltage VIN12 may be higher than the input voltage VIN5. Either one of the input voltage VIN5 or VIN12 is output as an output voltage VOUT from the output terminal TOUT.

The switch circuit SW5 is set to a conduction state (or a connected state) or an interrupted state (or an unconnected state) in accordance with the voltage VG5. When the voltage VG5 sets the switch circuit SW5 to the conduction state, the switch circuit SW5 outputs from the output terminal the input voltage VIN5 that has been input from the input terminal. When the voltage VG5 sets it to the interrupted state, the switch circuit SW5 interrupts the output of the input voltage VIN5 that has been input from the input terminal. The switch circuit SW5 has a threshold voltage Vth. When the voltage VG5 is higher than the input voltage VIN5 by the threshold voltage Vth or more, the switch circuit SW5 is set to the conduction state. On the other hand, when the voltage VG5 is lower than the sum of the input voltage VIN5 and the threshold voltage Vth, the switch circuit SW5 is set to the interrupted state.

The switch circuit SW12 is set to the conduction state or interrupted state in accordance with the voltage VG12. When the voltage VG12 sets the switch circuit SW12 to the conduction state, the switch circuit SW12 outputs from the output terminal the input voltage VIN12 that has been input to the input terminal. When the voltage VG12 sets it to the interrupted state, the switch circuit SW12 interrupts the output of the input voltage VIN12 that has been input to the input terminal. The switch circuit SW12 has a threshold voltage Vth that is the same as that of the switch circuit SW5. When the voltage VG12 is higher than the input voltage VIN12 by the threshold voltage Vth or more, the switch circuit SW12 is set to the conduction state. On the other hand, when the voltage VG12 is lower than the sum of the input voltage VIN12 and the threshold voltage Vth, the switch circuit SW12 is set to the interrupted state.

The driver 11 drives the switch circuit SW12 and generates the voltage VG12. The correction circuit 12 corrects the value of the voltage VG12. For instance, the correction circuit 12 receives the voltage VG12, and outputs a voltage VG12c, which is lower than the voltage VG12 by the threshold voltage Vth of the switch circuit SW12.

The comparator 13 compares the input voltage VIN5 that has been input to the positive input terminal (unreversed input terminal) and the voltage VG12c that has been input to the negative input terminal (reversed input terminal), and outputs to the switch circuit SW5 the voltage VG5 in accordance with the result of the comparison. In particular, in comparison of the input voltage VIN5 and the voltage VG12c, when the input voltage VIN5 is higher than the voltage VG12c, the comparator 13 outputs the voltage VG5 that sets the switch circuit SW5 to the conduction state. On the other hand, when the input voltage VIN5 is lower than the voltage VG12c, the comparator 13 outputs the voltage VG5 that sets the switch circuit SW5 to the interrupted state.

The connection of the circuit elements in the semiconductor integrated circuit 10 will be described below.

The input voltage VIN5 is input to the input terminal TIN5. The input terminal TIN5 is coupled to the input terminal of the switch circuit SW5. The output terminal of the switch circuit SW5 is coupled to the output terminal TOUT.

The input voltage VIN12 is input to the input terminal TIN12. The input terminal TIN12 is coupled to the input terminal of the switch circuit SW12. The output terminal of the switch circuit SW12 is coupled to the output terminal TOUT.

The driver 11 is coupled to a control terminal of the switch circuit SW12. The driver 11 is also coupled to an input terminal of the correction circuit 12.

The input terminal TIN5 is coupled to the positive input terminal of the comparator 13. An output terminal of the correction circuit 12 is coupled to the negative input terminal of the comparator 13. An output terminal of the comparator 13 is coupled to a control terminal of the switch circuit SW5.

Next, An operation of the semiconductor integrated circuit 10 illustrated in FIG. 1 will be described. FIG. 2 is a timing chart showing the operations of the semiconductor integrated circuit 10 according to the first embodiment. Here, an operation performed when the output voltage VOUT is switched from the input voltage VIN5 to the input voltage VIN12 will be discussed. As mentioned earlier, the input voltage VIN12 is higher than the input voltage VIN5.

At time t1 in FIG. 2, the switch circuit SW5 is set to the conduction state in accordance with the voltage VG5. The input voltage VIN5 is therefore output as an output voltage VOUT. At this time, a current IIN5 passes from the power supply that supplies the input voltage VIN5, to the input terminal TIN5. The switch circuit SW12 is set to the interrupted state in accordance with the voltage VG12.

Next, at time t2, the driver 11 is activated so as to switch the output voltage VOUT from the input voltage VIN5 to the input voltage VIN12. The value of the voltage VG12 is thereby increased as indicated in FIG. 2.

At time t3, when the voltage VG12c obtained by correcting of the voltage VG12 by the correction circuit 12 becomes equal to or higher than the input voltage VIN5, the switch circuit SW5 is set to the interrupted state in accordance with the voltage VG5 output by the comparator 13. In parallel to this, the switch circuit SW12 is set to the conduction state by the voltage VG12. That is, when VG12−Vth≥VIN5, the switch circuit SW5 is set to the interrupted state, while the switch circuit SW12 is set to the conduction state. Due to the input voltage VIN5 being interrupted, the input voltage VIN12 is output as an output voltage VOUT.

As described above, since the setting of the switch circuit SW5 to the interrupted state and the setting of the switch circuit SW12 to the conduction state are conducted at substantially the same time, there is no time period in which the switch circuits SW5 and SW12 are both in the conduction state. As a result, the current IIN5 that passes through the input terminal TIN5 does not become a negative current, as indicated in FIG. 2. That is, there will be no reverse current passing from the input voltage VIN12 side (from the input terminal TIN12) to the input voltage VIN5 side (to the input terminal TIN5).

Thereafter, at time t4, the output voltage VOUT reaches the input voltage VIN12, and the input voltage VIN12 is output as an output voltage VOUT.

1.1 Configuration of Semiconductor Integrated Circuit

Next, details of a configuration of the semiconductor integrated circuit 10 according to the first embodiment will be discussed. FIG. 3 is a circuit diagram illustrating the configuration of the semiconductor integrated circuit according to the first embodiment.

As illustrated in FIG. 3, the semiconductor integrated circuit 10 includes switch circuits SW5 and SW12, a driver 11, a correction circuit 12, a comparator 13, a transistor T6, resistors R1, R2, R3, and R4, current supplies CS1 and CS2, input terminals TIN5 and TIN12, and an output terminal TOUT.

The switch circuit SW5 includes n-channel MOS field effect transistors T1 and T2, and diodes D1 and D2. Hereinafter, an n-channel MOS field effect transistor will be referred to as an nMOS transistor. The nMOS transistors T1 and T2 respectively have a threshold voltage Vth. The diode D1 is a parasitic diode (or a body diode) formed in a pn junction between the source and drain of the nMOS transistor T1 owing to a MOS field effect transistor structure. The diode D2 is a parasitic diode (or a body diode) formed in a pn junction between the source and drain of the nMOS transistor T2 owing to a MOS field effect transistor structure. The switch circuit SW5 further includes an input terminal, an output terminal, and a control terminal.

The first end (e.g., drain) of the nMOS transistor T1 corresponds to the input terminal of the switch circuit SW5. The input voltage VIN5 is supplied to the input terminal of the switch circuit SW5. The second end (e.g., source) of the nMOS transistor T1 is coupled to the first end (e.g., source) of the nMOS transistor T2. The second end (e.g., drain) of the nMOS transistor T2 corresponds to the output terminal of the switch circuit SW5. An output voltage VOUT is output from the output terminal of the switch circuit SW5. The cathode of the diode D1 is coupled to the first end of the nMOS transistor T1, and the anode of the diode D1 is coupled to the second end of the nMOS transistor T1. The anode of the diode D2 is coupled to the first end of the nMOS transistor T2, and the cathode of the diode D2 is coupled to the second end of the nMOS transistor T2.

The gates of the nMOS transistors T1 and T2 correspond to the control terminal of the switch circuit SW5. The voltage VG5 is input to the control terminal of the switch circuit SW5. The nMOS transistors T1 and T2 are set to the conduction state or interrupted state in accordance with the voltage VG5 input to the control terminal. When the nMOS transistors T1 and T2 are set to the conduction state, the switch circuit SW5 outputs the input voltage VIN5 supplied to the input terminal, from the output terminal. On the other hand, when the nMOS transistors T1 and T2 are set to the interrupted state, the switch circuit SW5 interrupts the input voltage VIN5 supplied to the input terminal.

The switch circuit SW12 includes nMOS transistors T3 and T4, and diodes D3 and D4. The nMOS transistors T3 and T4 respectively have the threshold voltage Vth that is the same as that of the nMOS transistors T1 and T2. The diode D3 is a parasitic diode (or a body diode) formed in a pn junction between the source and drain of the nMOS transistor T3 owing to a MOS field effect transistor structure. The diode D4 is a parasitic diode (or a body diode) formed in a pn junction between the source and drain of the nMOS transistor T4 owing to a MOS field effect transistor structure. The switch circuit SW12 further includes an input terminal, an output terminal, and a control terminal.

The first end (e.g., drain) of the nMOS transistor T3 corresponds to the input terminal of the switch circuit SW12. The input voltage VIN12 is supplied to the input terminal of the switch circuit SW12. The second end (e.g., source) of the nMOS transistor T3 is coupled to the first end (e.g., source) of the nMOS transistor T4. The second end (e.g., drain) of the nMOS transistor T4 corresponds to the output terminal of the switch circuit SW12. An output voltage VOUT is output from the output terminal of the switch circuit SW12. The cathode of the diode D3 is coupled to the first end of the nMOS transistor T3, and the anode of the diode D3 is coupled to the second end of the nMOS transistor T3. The anode of the diode D4 is coupled to the first end of the nMOS transistor T4, and the cathode of the diode D4 is coupled to the second end of the nMOS transistor T4.

The gates of the nMOS transistors T3 and T4 correspond to the control terminal of the switch circuit SW12. The voltage VG12 is input to the control terminal of the switch circuit SW12. The nMOS transistors T3 and T4 are set to the conduction state or interrupted state in accordance with the voltage VG12 input to the control terminal. When the nMOS transistors T3 and T4 are set to the conduction state, the switch circuit SW12 outputs the input voltage VIN12 supplied to the input terminal, from the output terminal. On the other hand, when the nMOS transistors T3 and T4 are set to the interrupted state, the switch circuit SW12 interrupts the input voltage VIN12 supplied to the input terminal.

The current supply CS2 supplies a current to the control terminal of the switch circuit SW12 and to the correction circuit 12. As mentioned earlier, the driver 11 is a circuit that drives the switch circuit SW12 and raises the voltage VG12.

The correction circuit 12 includes the nMOS transistor T5. The nMOS transistor T5 has the threshold voltage Vth that is the same as that of the nMOS transistors T3 and T4. The nMOS transistor T5 receives the voltage VG12 at the drain, and outputs from the source the voltage VG12c, which is lower than the voltage VG12 by the threshold voltage Vth.

The comparator 13 outputs, in accordance with the result of the comparison of the voltages input to the negative input terminal and to the positive input terminal, a voltage that turns the nMOS transistor T6 to an ON state (or a conductive state) or to an OFF state (or a non-conductive state). The input voltage VIN5 is input to the negative input terminal of the comparator 13 via the resistor R2. The voltage VG12c is input to the positive input terminal of the comparator 13 via the resistor R4. When the voltage VG12c is lower than the input voltage VIN5, the comparator 13 outputs a voltage that turns the nMOS transistor T6 to the OFF state. On the other hand, when the voltage VG12c is higher than the input voltage VIN5, the comparator 13 outputs a voltage that turns the nMOS transistor T6 to the ON state.

The current supply CS1 supplies a current to the control terminal of the switch circuit SW5 and to the nMOS transistor T6, as a result of which the voltage VG5 is raised.

The nMOS transistor T6 determines the value of the voltage VG5 to be input to the control terminal of the switch circuit SW5. The nMOS transistor T6 is turned to the OFF state or to the ON state in accordance with the voltage output from the comparator 13. When the nMOS transistor T6 is in the OFF state, the voltage VG5 is maintained at a value obtained by adding the threshold voltage Vth to the input voltage VIN5 or at a higher value. On the other hand, when the nMOS transistor T6 is in the ON state, the voltage VG5 is decreased to a ground voltage GND.

The resistors R1 to R4 are bleeder resistors coupled to the positive input terminal and negative input terminal of the comparator 13. The resistors R1 and R2 divide the voltage VIN5 to be input to the negative input terminal of the comparator 13 so as to maintain the voltage input to the negative input terminal at a constant level. The resistors R3 and R4 divide the voltage VG12c to be input to the positive input terminal of the comparator 13 so as to maintain the voltage input to the positive input terminal at a constant level. The resistors R1 and R3 have the same resistance value, and the resistors R2 and R4 have the same resistance value.

The connection of the circuit elements in the semiconductor integrated circuit 10 will be described below.

The input voltage VIN5 is supplied to the input terminal TIN5. The input terminal TIN5 is coupled to the input terminal of the switch circuit SW5. The output terminal of the switch circuit SW5 is coupled to the output terminal TOUT. The input terminal TIN5 is coupled to the negative input terminal of the comparator 13 and the resistor R1 via the resistor R2. The resistor R1 is coupled to a ground voltage end. The ground voltage GND is supplied to the ground voltage end.

The control terminal of the switch circuit SW5 is coupled to the current supply CS1. The current supply CS1 is coupled to the voltage supply VREG. The control terminal of the switch circuit SW5 is coupled to the drain of the nMOS transistor T6. The source of the nMOS transistor T6 is coupled to the ground voltage end.

The input voltage VIN12 is supplied to the input terminal TIN12. The input terminal TIN12 is coupled to the input terminal of the switch circuit SW12. The output terminal of the switch circuit SW12 is coupled to the output terminal TOUT.

The control terminal of the switch circuit SW12 is coupled to the driver 11 and current supply CS2. The current supply CS2 is coupled to the voltage supply VREG. The control terminal of the switch circuit SW12 is also coupled to the input terminal of the correction circuit 12 (i.e., the drain and gate of the nMOS transistor T5). The output terminal of the correction circuit 12 (i.e., the source of the nMOS transistor T5) is coupled to the positive input terminal of the comparator 13 and the resistor R3 via the resistor R4. The resistor R3 is coupled to the ground voltage end.

Then, as an output voltage VOUT, the input voltage VIN5 or VIN12 is output from the output terminal TOUT.

1.2 Operations of Semiconductor Integrated Circuit

Next, the operations of the semiconductor integrated circuit 10 illustrated in FIG. 3 will be described. Here, the operation performed at the time of switching the output voltage VOUT from the voltage VIN5 to the voltage VIN12 will be discussed. The voltage VIN12 is higher than the voltage VIN5. For instance, the voltage VIN5 is 5 volts, and the voltage VIN12 is 12 volts.

When the voltage VIN5 is output as an output voltage VOUT, the semiconductor integrated circuit 10 is in a state as described below. The switch circuit SW5 is set to the conduction state in accordance with the voltage VG5. Because of the voltage VG12c being lower than the voltage VIN5, the comparator 13 outputs a voltage that will turn the nMOS transistor T6 to the OFF state. The nMOS transistor T6 is thereby set to the OFF state, and the voltage VG5 maintains a voltage of "VIN5+Vth" or higher. As a result, the switch circuit SW5 is set to the conduction state to output the voltage VIN5 as an output voltage VOUT. Because of the voltage VG12 being lower than "VIN12+Vth", the switch circuit SW12 is set to the interrupted state.

Next, in order to switch the output voltage VOUT from the voltage VIN5 to the voltage VIN12, the driver 11 and current supply CS2 raise the voltage VG12. When the raised voltage VG12 reaches "VIN12+Vth" or higher, the switch circuit SW12 is switched from the interrupted state to the conduction state. The voltage VIN12 is thereby output as an output voltage VOUT from the output terminal TOUT.

In parallel to the above, the voltage VG12c output from the nMOS transistor T5 becomes "VG12−Vth", which is the output voltage VOUT, when the voltage VG12 reaches "VIN12+Vth" or higher. Here, the threshold voltage Vth of the nMOS transistors T3 and T4 that constitute the switch circuit SW12 is the same as the threshold voltage Vth of the nMOS transistor T5, and therefore the voltage VG12c has substantially the same value as that of the output voltage VOUT.

The output voltage VOUT is divided by the resistor R3 and resistor R4, and the divided voltage is input to the positive input terminal of the comparator 13. The voltage VIN5 is divided by the resistor R1 and resistor R2, and the divided voltage is input to the negative input terminal of the comparator 13. Since the output voltage VOUT is higher than the voltage VIN5, the comparator 13 outputs a voltage that turns the nMOS transistor T6 to the ON state. With the nMOS transistor T6 turned to the ON state, the voltage VG5 is decreased to a level equal to or lower than the output voltage VOUT. As a result, the switch circuit SW5 is set to the interrupted state to interrupt the output of the voltage VIN5.

As described above, in parallel to the switch circuit SW12 switching from the interrupted state to the conduction state, the switch circuit SW5 switches from the conduction state to the interrupted state. That is, setting of the switch circuit SW12 from the interrupted state to the conduction state is conducted substantially at the same time as (or in other words, in parallel to) setting of the switch circuit SW5 from the conduction state to the interrupted state so that there is no time period in which the switch circuits SW5 and SW12 are both in the conduction state. Thus, when switching the output voltage VOUT from the voltage VIN5 to the voltage VIN12, no reverse current occurs from the input voltage VIN12 side to the input voltage VIN5 side.

1.3 Advantageous Effects of First Embodiment

According to the first embodiment, a semiconductor integrated circuit capable of preventing a reverse current that tends to flow to the input power supply at the time of switching the input voltages can be provided.

The advantageous effects of the first embodiment will be discussed below.

With the configuration of the first embodiment, at the time of switching from the input voltage VIN5 to the input voltage VIN12, the switch circuit SW12 is set from the interrupted state to the conduction state when the voltage VG12 reaches "VOUT+Vth". At the same timing, the voltage VG12c, which is obtained by correcting of the voltage VG12 by the correction circuit 12 and is approximately equal to the output voltage VOUT, is compared with the input voltage VIN5, and when the voltage VG12c becomes higher than the input voltage VIN5, the switch circuit SW5 is switched from the conduction state to the interrupted state.

In this manner, the period in which the switch circuit SW5 and switch circuit SW12 are both in the conduction state can be eliminated. As a result, when switching the output voltage VOUT from the voltage VIN5 to the voltage VIN12, a reverse current from the input voltage VIN12 side (from the input terminal TIN12) to the input voltage VIN5 side (to the input terminal TIN5) can be prevented.

In addition, with the configuration of the first embodiment, the prevention of a reverse current can reduce power consumption at the time of switching voltages.

2. Second Embodiment

A semiconductor integrated circuit according to a second embodiment will be described. In the second embodiment, an example is given in which prevention of a reverse current and prevention of noise in the output voltage VOUT are performed at the time of switching the input voltages by monitoring the gate signals input to the control terminals of the switch circuits SW5 and SW12. In the second embodiment, differences with respect to the first embodiment will be mainly focused on.

2.1 Configuration of Semiconductor Integrated Circuit

The configuration of the semiconductor integrated circuit according to the second embodiment will be discussed below. FIG. 4 is a circuit diagram illustrating the configuration of the semiconductor integrated circuit according to the second embodiment.

As illustrated in FIG. 4, a semiconductor integrated circuit 20 includes switch circuits SW5 and SW12, a true reverse current blocking (TRCB) 21, slew-rate control circuits SRC5 and SRC12, charge pumps PU1 and PU2, nMOS transistors T11, T12, T13, T14, T15, and T16, resistors R11, R12, R13, R14, R15, and R16, input terminals TIN5 and TIN12, and an output terminal TOUT.

The structures of the switch circuits SW5 and SW12 are the same as those of the first embodiment. The input voltage VIN5 is supplied to the input terminal of the switch circuit SW5. The input voltage VIN12 is supplied to the input terminal of the switch circuit SW12. The output voltage VOUT is output from the output terminal of the switch circuit SW5 or SW12.

The TRCB 21 is a circuit designed to block a reverse current flowing toward the power supply that supplies the input voltage VIN5 or VIN12. The TRCB 21 controls the switching of the switch circuits SW5 and SW12 from the conduction state to the interrupted state and from the interrupted state to the conduction state. The TRCB 21 outputs voltages EN1 and EN2 that respectively determine the conduction state or interrupted state of the switch circuits SW5 and SW12. The details of the structure of the TRCB 21 will be discussed later.

The slew-rate control circuit SRC5 determines the change of the voltage VG5 to be input to the control terminal of the switch circuit SW5, and controls the change of the voltage output from the switch circuit SW5. The slew-rate control circuit SRC12 determines the change of the voltage VG12 to be input to the control terminal of the switch circuit SW12, and controls the change of the voltage output from the switch circuit SW12. A slew rate represents the rate or gradient of a change in the voltage, or in other words the amount of change in voltage per unit time.

The charge pump PU1 raises the input voltage VIN5 to generate a voltage VG5 to be supplied to the control terminal of the switch circuit SW5. The charge pump PU2 raises the input voltage VIN12 to generate a voltage VG12 to be supplied to the control terminal of the switch circuit SW12.

The nMOS transistor T11 determines the value of the voltage VG5 to be supplied to the control terminal of the switch circuit SW5. The nMOS transistor T11 is turned to the OFF state or ON state in accordance with the voltage EN1 output from the TRCB 21. When the nMOS transistor T11 is in the OFF state, the voltage VG5 is maintained at a level obtained by adding the threshold voltage Vth to the input voltage VIN5 or a higher level. In contrast, when the nMOS transistor T11 is in the ON state, the voltage VG5 is decreased to the output voltage VOUT or lower.

The nMOS transistor T12 is turned to the OFF state or ON state in accordance with the voltage output from the slew-rate control circuit SRC5. The change in the voltage of the voltage VG5 to be supplied to the control terminal of the switch circuit SW5 is thereby determined.

The nMOS transistor T13 corresponds to the correction circuit 12 in the first embodiment, and has the same threshold voltage Vth as those of the nMOS transistors T1 and T2. The nMOS transistor T13 receives the voltage VG5 at the drain, and outputs from the source a voltage lower than the voltage VG5 by the threshold voltage Vth.

The nMOS transistor T14 determines the value of the voltage VG12 to be supplied to the control terminal of the switch circuit SW12. The nMOS transistor T14 is turned to the OFF state or ON state in accordance with the voltage EN2 output from the TRCB 21. When the nMOS transistor T14 is in the OFF state, the voltage VG12 is maintained at the level obtained by adding the threshold voltage Vth to the input voltage VIN12 or at a higher level. In contrast, when the nMOS transistor T14 is in the ON state, the voltage VG12 is decreased to the output voltage VOUT or lower.

The nMOS transistor T15 is turned to the OFF state or ON state in accordance with the voltage output from the slew-rate control circuit SRC12. The change in the voltage of the voltage VG12 to be supplied to the control terminal of the switch circuit SW12 is thereby determined.

The nMOS transistor T16 corresponds to the correction circuit 12 of the first embodiment, and has the same threshold voltage Vth as those of the nMOS transistors T3 and T4. The nMOS transistor T16 receives the voltage VG12 at the drain, and outputs from the source a voltage lower than the voltage VG12 by the threshold voltage Vth.

The resistors R11 to R16 are bleeder resistors. The resistors R11 and R12 divide the voltage output from the nMOS transistor T13 so as to maintain the voltage VMG5 at a stable level. The resistors R13 and R14 divide the voltage output from the nMOS transistor T16 so as to maintain the voltage VMG12 at a stable level. The resistors R15 and R16 divide the output voltage VOUT so as to maintain the voltage VOUTa to be input to the TRCB 21, at a stable level. The resistors R11, R13, and R15 have the same resistance value, while the resistors R12, R14, and R16 have the same resistance value.

The connection of the circuit elements in the semiconductor integrated circuit 20 will be described below.

The input voltage VIN5 is supplied to the input terminal TIN5. The input terminal TIN5 is coupled to the input terminal of the switch circuit SW5. The output terminal of the switch circuit SW5 is coupled to the output terminal TOUT.

The control terminal of the switch circuit SW5 is coupled to the drain of the nMOS transistor T11. The source of the nMOS transistor T11 is coupled to the ground voltage end. The control terminal of the switch circuit SW5 is coupled to the drain of the nMOS transistor T12. The source of the nMOS transistor T12 is coupled to the ground voltage end.

The input terminal TIN5 is coupled to the input terminal of the charge pump PU1. The output terminal of the charge pump PU1 is coupled to the control terminal of the switch circuit SW5. The output terminal of the charge pump PU1 is coupled to the drain and gate of the nMOS transistor T13. The source of the nMOS transistor T13 is coupled to the ground voltage end via the resistors R12 and R11, which are serially coupled to each other. The voltage VMG5 is output from the node between the resistors R12 and R11.

The voltage VMG5 is input to the input terminal of the slew-rate control circuit SRC5. The output terminal of the slew-rate control circuit SRC5 is coupled to the gate of the nMOS transistor T12.

The input voltage VIN12 is supplied to the input terminal TIN12. The input terminal TIN12 is coupled to the input terminal of the switch circuit SW12. The output terminal of the switch circuit SW12 is coupled to the output terminal TOUT.

The control terminal of the switch circuit SW12 is coupled to the drain of the nMOS transistor T14. The source of the nMOS transistor T14 is coupled to the ground voltage end. The ground voltage GND is supplied to the ground voltage end. The control terminal of the switch circuit SW12 is coupled to the drain of the nMOS transistor T15. The source of the nMOS transistor T15 is coupled to the ground voltage end.

The input terminal TIN12 is coupled to the input terminal of the charge pump PU2. The output terminal of the charge pump PU2 is coupled to the control terminal of the switch circuit SW12. The output terminal of the charge pump PU2 is coupled to the drain and gate of the nMOS transistor T16. The source of the nMOS transistor T16 is coupled to the ground voltage end via the resistors R14 and R13, which are serially coupled to each other. The voltage VMG12 is output from the node between the resistors R14 and R13.

The voltage VMG12 and switch signal SEL are respectively input to the input terminal of the slew-rate control circuit SRC12. The output terminal of the slew-rate control circuit SRC12 is coupled to the gate of the nMOS transistor T15.

The output voltage VOUTa, voltage VMG12, voltage VMG5, switch signal SEL, and input voltage VIN5 are individually input to the input terminal of the TRCB 21. The output terminal of the TRCB 21 is coupled to the gates of the nMOS transistors T11 and T14. The TRCB 21 outputs the voltage EN1 to the gate of the nMOS transistor T11 and the voltage EN2 to the gate of the nMOS transistor T14.

The structure of the TRCB 21 in the semiconductor integrated circuit 20 will be described below. FIG. 5 is a circuit diagram illustrating the structure of the TRCB 21 in the semiconductor integrated circuit 20.

As illustrated in FIG. 5, the TRCB 21 includes comparators CP1 and CP2, AND circuits AD1 and AD2, an OR circuit OR1, an nMOS transistor T21, switches S1 and S2, and a voltage supply E1.

The comparator CP1 compares the voltage VBUSp input to the positive input terminal with the voltage VIN5 or VIN5a input to the negative input terminal, and outputs the voltage VBUSo in accordance with the result of the comparison. The comparator CP2 compares the voltage VIN5 or VIN5a input to the positive input terminal with the voltage VMG5 input to the negative input terminal, and outputs the voltage VMG5o in accordance with the result of the comparison.

The AND circuit AD1 performs an AND operation on the voltage VBUSo output from the comparator CP1 and the switch signal SEL, and outputs a voltage in accordance with the result of the operation. The AND circuit AD2 performs an AND operation on the voltage VMG5o output from the comparator CP2 and the voltage EN2 output from the OR circuit OR1, and outputs a voltage EN1 in accordance with the result of the operation.

The OR circuit OR1 performs an OR operation on the voltage VBUSo output from the comparator CP1, the voltage VMG5o output from the comparator CP2, and the switch signal SEL, and outputs a voltage EN2 in accordance with the result of the operation.

The nMOS transistor T21 outputs the voltage VMG5 or the ground voltage GND to the negative input terminal of the comparator CP2 in accordance with the voltage VBUSo input to the gate.

The switch S1 couples the terminal to which the output voltage VOUTa or voltage VMG12 is supplied, to the terminal of the voltage VBUSp in accordance with the voltage EN1. The switch S2 is designed to prevent chattering. The switch S2 supplies the voltage VIN5a that was decreased from the voltage VIN5 by the bias of the voltage supply E1, or the voltage VIN5, to the negative input terminal of the comparator CP1 and the positive input terminal of the comparator CP2, in accordance with the voltage output from the AND circuit AD1.

The connection of the circuit elements of the TRCB 21 will be described below.

The output voltage VOUTa is supplied to the first input terminal of the switch S1. The voltage VMG12 is supplied to the second input terminal of the switch S1. The output terminal of the switch S1 is coupled to the positive input terminal of the comparator CP1.

The input voltage VIN5 is supplied to the first terminal of the switch S2. The second terminal of the switch S2 is coupled to the negative input terminal of the comparator CP1. The voltage supply E1 is coupled between the first terminal and second terminal of the switch S2. The output terminal of the comparator CP1 is coupled to the first input terminal of the AND circuit AD1. The switch signal SEL is input to the second input terminal of the AND circuit AD1. The output terminal of the AND circuit AD1 is coupled to the control terminal of the switch S2.

The output terminal of the comparator CP1 is coupled to the gate of the nMOS transistor T21. The voltage VMG5 is input to the drain of the nMOS transistor T21. The source of the nMOS transistor T21 is coupled to the ground voltage end.

The drain of the nMOS transistor T21 is coupled to the negative input terminal of the comparator CP2. The second terminal of the switch S2 is coupled to the positive input terminal of the comparator CP2.

The output terminal of the comparator CP2 is coupled to the first input terminal of the OR circuit OR1. The output terminal of the comparator CP1 is coupled to the second input terminal of the OR circuit OR1. The switch signal SEL is input to the third input terminal of the OR circuit OR1.

The output terminal of the comparator CP2 is coupled to the first input terminal of the AND circuit AD2. The output terminal of the OR circuit OR1 is coupled to the second input terminal of the AND circuit AD2.

In the TRCB 21 constituted as above, the voltage EN2 is output from the output terminal of the OR circuit OR1, and the voltage EN1 is output from the output terminal of the AND circuit AD2.

2.2 Operations of Semiconductor Integrated Circuit

Next, the operations of the semiconductor integrated circuit 20 according to the second embodiment will be described. Here, the operations of switching the output voltage VOUT from the voltage VIN5 to the voltage VIN12 and from the voltage VIN12 to the voltage VIN5 will be discussed. In a manner similar to the first embodiment, the voltage VIN12 is higher than the voltage VIN5, where for instance, the voltage VIN5 is 5 volts, and the voltage VIN12 is 12 volts.

In the semiconductor integrated circuit 20, the output voltage VOUT is switched to the input voltage VIN5 or VIN12 by the switch signal SEL. The TRCB 21 monitors the output voltage VOUT, and voltages VMG12 and VMG5, and thereby controls the conduction state and interrupted state of the switch circuits SW5 and SW12. The period in which the switch circuits SW5 and SW12 are both in the conduction state at the same time is reduced, and a reverse current flowing to the power supply side of the input voltage is suppressed. Furthermore, by monitoring the rising edge of the gate signal of the switch circuit SW5, the switch circuit SW12 can be switched from the conduction state to the interrupted state substantially at the same time as switching the switch circuit SW5 from the interrupted state to the conduction state in response to the rising edge of the gate signal of the switch circuit SW5. In this manner, noise that appears in the output voltage VOUT at the time of switching the input voltages can be suppressed.

The operation performed when switching the output voltage VOUT from the voltage VIN5 to the voltage VIN12 will be explained below.

When switching the output voltage VOUT from the input voltage VIN5 to the input voltage VIN12, the switch circuit SW5 is switched from the conduction state to the interrupted state in parallel to the switch circuit SW12 being switched from the interrupted state to the conduction state, by monitoring the voltage VMG12.

Figure 6:
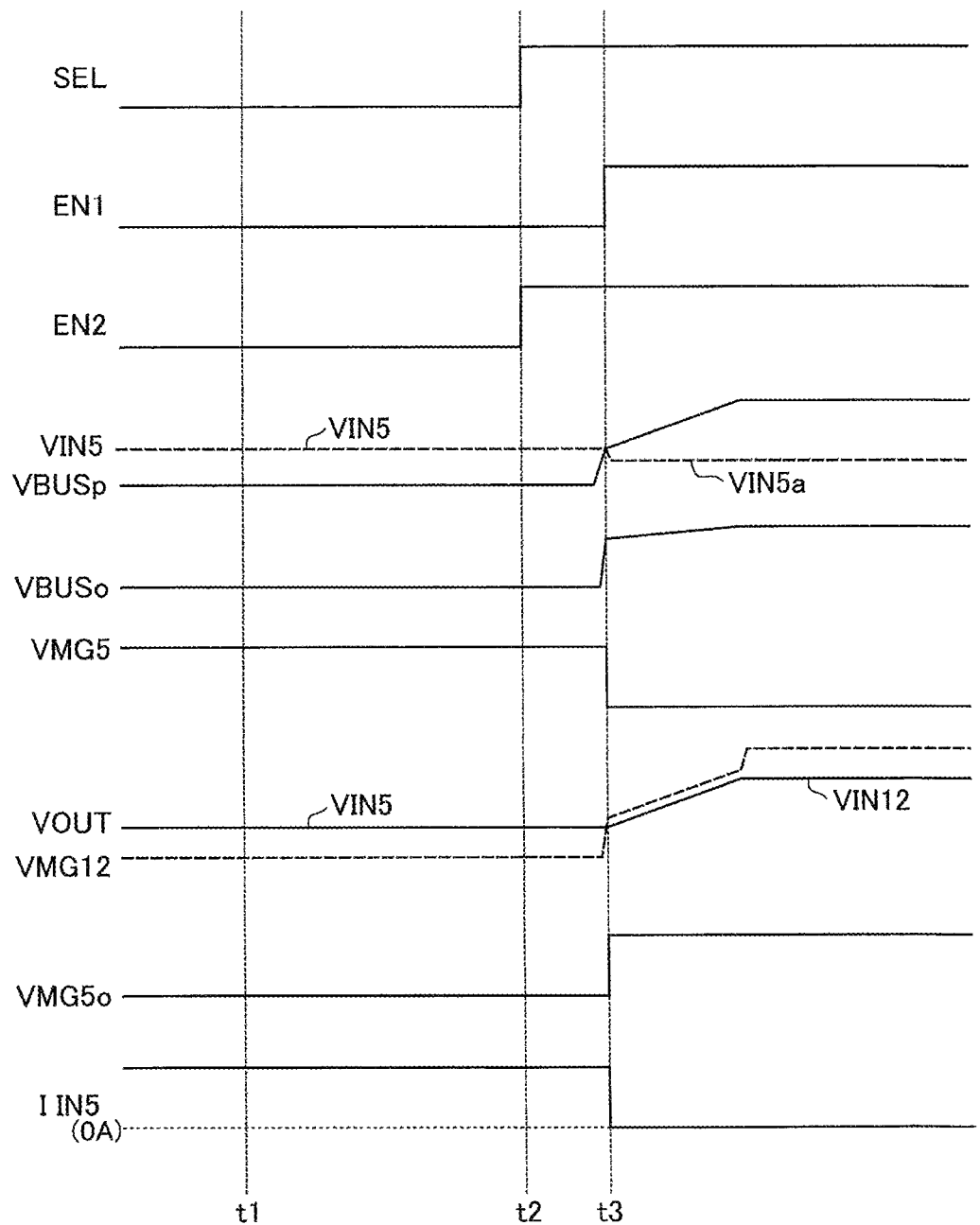
FIGS. 6 and 7 are timing charts showing operations at the time of switching voltages in the semiconductor integrated circuit according to the second embodiment.

FIG. 6 is a timing chart showing the operations at the time of voltage switching from the input voltage VIN5 to the input voltage VIN12 in the semiconductor integrated circuit 20 according to the second embodiment.

At time t1, voltage waveforms at the time of the voltage VIN5 being output as an output voltage VOUT are indicated. When the voltage VIN5 is output as an output voltage VOUT, the voltage EN1 output from the AND circuit AD2 and the switch signal SEL are set to a low level (hereinafter referred to as "L"). When the voltage EN1 is set to "L", the switch S1 is coupled to the terminal to which the voltage VMG12 is supplied. As a result, the voltage VMG12 is input as a voltage VBUSp to the positive input terminal of the comparator CP1. The input voltage VIN5 is input to the negative input terminal of the comparator CP1. Since the voltage VBUSp is lower than the voltage VIN5, "L" is output as a voltage VBUSo from the output terminal of the comparator CP1.

When "L" is output as the voltage VBUSo from the comparator CP1, "L" is input to the first input terminal of the AND circuit AD1. "L" is input as a switch signal SEL to the second input terminal of the AND circuit AD1. As a result, "L" is output from the output terminal of the AND circuit AD1. The switch S2 thereby maintains a connected state (or a closed state).

When "L" is output as the voltage VBUSo from the comparator CP1, the nMOS transistor T21 is turned to the OFF state. As a result, the voltage VMG5 is input to the negative input terminal of the comparator CP2. The input voltage VIN5 is input to the positive input terminal of the comparator CP2. Since the voltage VIN5 is lower than the voltage VMG5, "L" is output as the voltage VMG5o from the output terminal of the comparator CP2.

When "L" is output as the voltage VMG5o from the comparator CP2, "L" is input to the first input terminal of the OR circuit OR1. Furthermore, "L" is input as the voltage VBUSo to the second input terminal of the OR circuit OR1, and "L" is input as the switch signal SEL to the third input terminal. As a result, "L" is output as the voltage EN2 from the output terminal of the OR circuit OR1.

When "L" is output as the voltage VMG5o from the comparator CP2, "L" is input to the first input terminal of the AND circuit AD2. "L" is input as the voltage EN2 to the second input terminal of the AND circuit AD2. As a result, "L" is output as the voltage EN1 from the output terminal of the AND circuit AD2.

Next, at time t2, the switch signal SEL rises from "L" to a high level (hereinafter referred to as "H"), and the operation for switching the output voltage VOUT from the input voltage VIN5 to the input voltage VIN12 is initiated.

When the switch signal SEL rises from "L" to "H", "H" is input to the third input terminal of the OR circuit OR1 and the second input terminal of the AND circuit AD1 as a switch signal SEL. When "H" is input to the third input terminal of the OR circuit OR1 as the switch signal SEL, "H" is output as a voltage EN2 from the output terminal of the OR circuit OR1.

Thereafter, the value of the voltage VMG12 rises, and the voltage VBUSp becomes higher than the voltage VIN5 at time t3. Then, "H" is output as a voltage VBUSo from the the output terminal of the comparator CP1.

When "H" is output as the voltage VBUSo from the comparator CP1, "H" is input to the first input terminal of the AND circuit AD1. With "H" input to the second input terminal of the AND circuit AD1 as a switch signal SEL, "H" is output from the output terminal of the AND circuit AD1. The switch S2 is thereby turned to an unconnected state (or an open state). As a result, the voltage VIN5a is input to the negative input terminal of the comparator CP1.

Furthermore, when "H" is output as the voltage VBUSo from the comparator CP1, the nMOS transistor T21 is turned to the ON state. The ground voltage GND is therefore input to the negative input terminal of comparator CP2. The voltage VIN5a is input to the positive input terminal of the comparator CP2. Since the voltage VIN5a is higher than the ground voltage GND, "H" is output as the voltage VMG5o from the output terminal of the comparator CP2.

When "H" is output as the voltage VMG5o from the comparator CP2, "H" is input to the the first input terminal of the OR circuit OR1. Furthermore, "H" is input to the second input terminal of the OR circuit OR1 as the voltage VBUSo, and "H" is input to the third input terminal as the switch signal SEL. For this reason, "H" is output as the voltage EN2 from the output terminal of the OR circuit OR1.

When "H" is output as the voltage VMG5o from the comparator CP2, "H" is input to the first input terminal of the AND circuit AD2. "H" is input to the second input terminal of the AND circuit AD2 as the voltage EN2. As a result, "H" is output as the voltage EN1 from the output terminal of the AND circuit AD2.

At the time of switching from the input voltage VIN5 to the input voltage VIN12, the switch circuit SW12 is switched from the interrupted state to the conduction state, and the switch circuit SW5 is switched from the conduction state to the interrupted state when the voltage VMG12 becomes higher than the voltage VIN5. That is, in parallel to the switch circuit SW12 switching from the interrupted state to the conduction state, the switch circuit SW5 switches from the conduction state to the interrupted state. In other words, approximately at the same time as the switch circuit SW12 being set to the conduction state from the interrupted state, the switch circuit SW5 is set to the interrupted state from the conduction state. As a result, at the time of switching from the input voltage VIN5 to the input voltage VIN12, no reverse current appears in the current IIN5 that passes through the input terminal TIN5, as illustrated in FIG. 6.

The operation performed when switching the output voltage VOUT from the voltage VIN12 to the voltage VIN5 will be explained below.

When switching the output voltage VOUT from the input voltage VIN12 to the input voltage VIN5, the switch circuit SW12 is switched from the conduction state to the interrupted state in parallel to the switch circuit SW5 switching from the interrupted state to the conduction state, by monitoring the output voltage VOUT.

Figure 7:
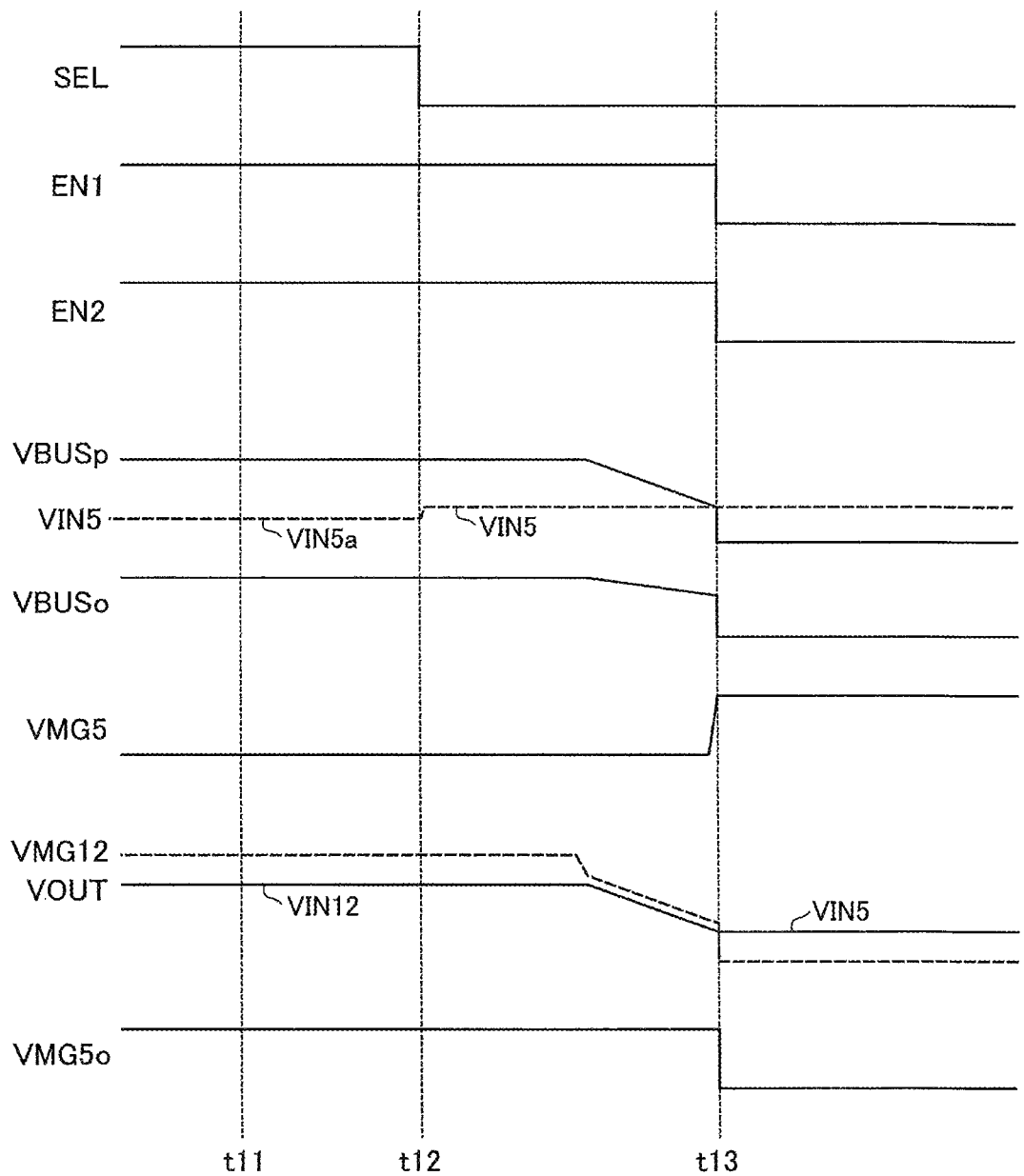

FIG. 7 is a timing chart showing the operations at the time of voltage switching from the input voltage VIN12 to the input voltage VIN5 in the semiconductor integrated circuit 20 according to the second embodiment.

At time t11, voltage waveforms at the time of the voltage VIN12 being output as an output voltage VOUT are indicated. When the voltage VIN12 is output as the output voltage VOUT, the voltage EN1 output from the AND circuit AD2 and the switch signal SEL are set to "H". When the voltage EN1 is set to "H", the switch S1 is coupled to a terminal to which the output voltage VOUTa is supplied. For this reason, the output voltage VOUTa is input as the voltage VBUSp to the positive input terminal of the comparator CP1. The voltage VIN5a, which is slightly lower than the input voltage VIN5, is input to the negative input terminal of the comparator CP1. With the voltage VBUSp being higher than the voltage VIN5a, "H" is output as the voltage VBUSo from the output terminal of the comparator CP1.

When "H" is output as the voltage VBUSo from the comparator CP1, "H" is input to the first input terminal of the AND circuit AD1. "H" is input to the second input terminal of the AND circuit AD1 as the switch signal SEL. For this reason, "H" is output from the output terminal of the AND circuit AD1. The switch S2 thereby maintains the unconnected state.

When "H" is output as the voltage VBUSo from the comparator CP1, the nMOS transistor T21 is turned to the ON state. As a result, the ground voltage GND is input to the negative input terminal of the comparator CP2. The input voltage VIN5a is input to the positive input terminal of the comparator CP2. Since the voltage VIN5a is higher than the ground voltage GND, "H" is output as the voltage VMG5o from the output terminal of the comparator CP2.

When "H" is output as the voltage VMG5o from the comparator CP2, "H" is input to the first input terminal of the OR circuit OR1. Furthermore, "H" is input as the voltage VBUSo to the second input terminal of the OR circuit OR1, and "H" is input as the switch signal SEL to the third input terminal. For this reason, "H" is output as the voltage EN2 from the output terminal of the OR circuit OR1.

When "H" is output as the voltage VMG5o from the comparator CP2, "H" is input to the first input terminal of the AND circuit AD2. "H" is input as the voltage EN2 to the second input terminal of the AND circuit AD2. As a result, "H" is output as the voltage EN1 from the output terminal of the AND circuit AD2.

Next, at time t12, the switch signal SEL falls from "H" to "L", and the operation for switching the output voltage VOUT from the input voltage VIN12 to the input voltage VIN5 is initiated.

When the switch signal SEL falls from "H" to "L", "L" is input as a switch signal SEL to the third input terminal of the OR circuit OR1 and the second input terminal of the AND circuit AD1. When "L" is input as a switch signal SEL to the second input terminal of the AND circuit AD1, "L" is output from the output terminal of the AND circuit AD1. For this reason, the switch S2 is turned to the connected state, and the input voltage VIN5 is input to the negative input terminal of the comparator CP1.

Thereafter, the output voltage VOUT decreases, and at time t13 when the voltage VBUSp becomes lower than the voltage VIN5, "L" is output as the voltage VBUSo from the output terminal of the comparator CP1.

When "L" is output as the voltage VBUSo from the comparator CP1, the nMOS transistor T21 is turned to the OFF state. As a result, the voltage VMG5 is input to the negative input terminal of the comparator CP2. The input voltage VIN5 is input to the positive input terminal of the comparator CP2. Since the voltage VIN5 is lower than the voltage VMG5, "L" is output as the voltage VMG5o from the output terminal of the comparator CP2.

When "L" is output as the voltage VMG5o from the comparator CP2, "L" is input to the first input terminal of the OR circuit OR1. Furthermore, "L" is input as the voltage VBUSo to the second input terminal of the OR circuit OR1, and "L" is input as the switch signal SEL to the third input terminal. As a result, "L" is output as the voltage EN2 from the output terminal of the OR circuit OR1.

Furthermore, when "L" is output as the voltage VMG5o from the comparator CP2, "L" is input to the first input terminal of the AND circuit AD2. "L" is input as the voltage EN2 to the second input terminal of the AND circuit AD2. As a result, "L" is output as the voltage EN1 from the output terminal of the AND circuit AD2.

At the time of switching from the input voltage VIN12 to the input voltage VIN5, the switch circuit SW5 is switched from the interrupted state to the conduction state, and the switch circuit SW12 is switched from the conduction state to the interrupted state, when the voltage VMG5 becomes higher than the voltage VIN5. That is, in parallel to the switch circuit SW5 switching from the interrupted state to the conduction state, the switch circuit SW12 switches from the conduction state to the interrupted state. In other words, approximately at the same time as the switch circuit SW5 is set to the conduction state from the interrupted state, the switch circuit SW12 is set to the interrupted state from the conduction state. As a result, at the time of switching from the input voltage VIN12 to the input voltage VIN5, noise that tends to be produced in the output voltage VOUT can be reduced.

2.3 Advantageous Effects of Second Embodiment

According to the second embodiment, a semiconductor integrated circuit capable of preventing a reverse current that tends to flow to the input power supply at the time of switching the input voltages can be provided. Furthermore, at the time of switching from the input voltage VIN12 to the input voltage VIN5, noise that tends to be produced in the output voltage VOUT can be reduced.

According to the second embodiment, the slew-rate control circuits SRC5 and SRC12 determine the changes in the voltages VG5 and VG12 to be input to the control terminals of the switch circuits SW5 and SW12. In this manner, the changes in the voltages output from the switch circuits SW5 and SW12 can be controlled.

In addition, the configuration of the second embodiment includes a circuit for monitoring the gate signals (or output voltage VOUT) of the switch circuits, and therefore does not require a circuit separately provided for monitoring the output voltage VOUT. This can reduce the design resources for the use of the semiconductor integrated circuit of the present embodiment.

According to the configuration of the second embodiment, the semiconductor integrated circuit of the embodiment can be integrated on a semiconductor substrate (or a semiconductor chip) so that the semiconductor integrated circuit can be formed into a circuit with low noise, in comparison to the configuration formed by discrete elements.

With the configuration of the second embodiment, a noise absorbing capacitor coupled for noise reduction to the input terminals TIN5 and TIN12 and to the output terminal TOUT can be downsized. This can reduce the area for mounting the noise absorbing capacitor, and can also reduce the costs for implementing the semiconductor integrated circuit according to the present embodiment. Other effects of the present embodiment are the same as the first embodiment.

3. Third Embodiment

A semiconductor integrated circuit according to the third embodiment will be described. In the third embodiment, an example of controlling the slew rate of the voltage VG12 (i.e., the gate signal) input to the switch circuit SW12 so as to cause no undershooting in the output voltage VOUT even under a heavy load will be dealt with. In the third embodiment, differences with respect to the second embodiment will be mainly focused on.

3.1 Configuration of Semiconductor Integrated Circuit

The configuration of the semiconductor integrated circuit according to the third embodiment will be discussed below. FIG. 8 is a circuit diagram illustrating the configuration of the semiconductor integrated circuit according to the third embodiment.

As illustrated in FIG. 8, a semiconductor integrated circuit 30 includes switch circuits SW5 and SW12, a TRCB 21, slew-rate control circuits SS1 and SRC5, a driver 31, charge pumps PU1 and PU2, nMOS transistors T11, T12, T13, T14, T15, and T16, resistors R11, R12, R13, R14, R15, and R16, input terminals TIN5 and TIN12, a slew rate terminal TSS1, and an output terminal TOUT.

The slew-rate control circuit SS1 determines the change in the voltage to be input to the control terminal of the switch circuit SW12, and thereby controls the change in the output voltage VOUT. The driver 31 supplies a current to the slew-rate control circuit SS1. Other structural elements of the present embodiment are the same as those of the second embodiment.

The connection of the circuit elements in the semiconductor integrated circuit 30 will be described below.

The voltage VMG12 and switch signal SEL are input to the input terminal of the slew-rate control circuit SS1. The slew rate terminal TSS1 is coupled to the input terminal of the slew-rate control circuit SS1. A capacitor C1 (not shown) is coupled to the slew rate terminal TSS1. The driver 31 is coupled to the input terminal of the slew-rate control circuit SS1. The output terminal of the slew-rate control circuit SS1 is coupled to the gate of the nMOS transistor T15. Other connections are the same as those of the second embodiment.

Figure 9:
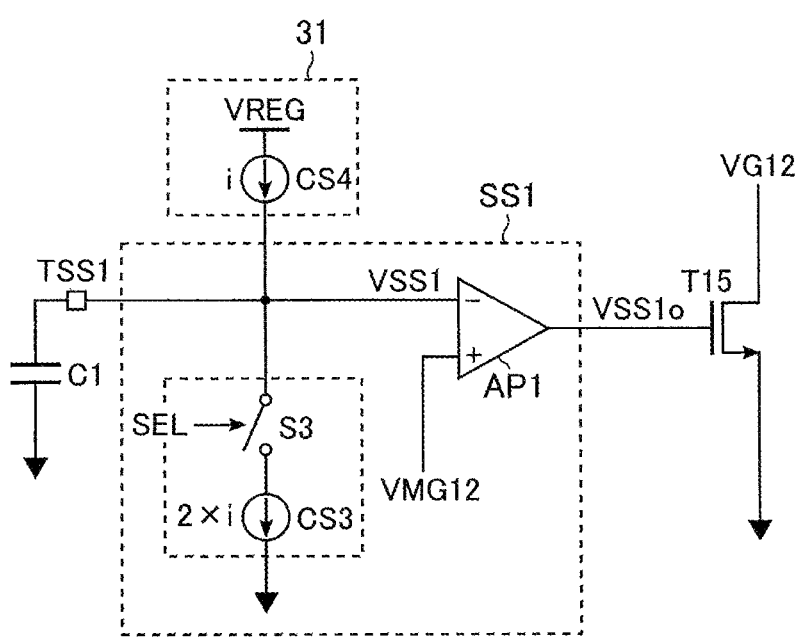
FIG. 9 is a circuit diagram illustrating a configuration of a slew-rate control circuit in the semiconductor integrated circuit according to the third embodiment.

The structure of the slew-rate control circuit SS1 in the semiconductor integrated circuit 30 will be described below. FIG. 9 is a circuit diagram illustrating the structure of the slew-rate control circuit SS1 in the semiconductor integrated circuit 30.

As illustrated in FIG. 9, the slew-rate control circuit SS1 includes an operational amplifier (e.g., differential amplifier circuit) AP1, a switch S3, and a current supply CS3. A current supply CS4 and a voltage supply VREG are coupled to the negative input terminal (reversed input terminal) of the operational amplifier AP1, the switch S3, and the slew rate terminal TSS1.

The operational amplifier AP1 compares the voltage VMG12 input to the positive input terminal (unreversed input terminal) with the voltage VSS1 input to the negative input terminal, and outputs the voltage VSS1o in accordance with the result of the comparison. When the switch signal SEL is at "H", the first terminal and second terminal of the switch S3 are set to the unconnected state, while when the switch signal SEL is at "L", the first terminal and second terminal are set to the connected state. The current supply CS4 supplies a constant current i. The current supply CS3 supplies a current 2·i, which is two times larger than the constant current i of the current supply CS4. The voltage supply VREG supplies a constant voltage to the current supply CS4.

The connection of the circuit elements of the slew-rate control circuit SS1 will be described below.

The negative input terminal of the operational amplifier AP1 is coupled to the slew rate terminal TSS1. The slew rate terminal TSS1 is coupled to the ground voltage end via the capacitor C1. The negative input terminal of the operational amplifier AP1 is coupled to the voltage supply VREG via the current supply CS4. The negative input terminal of the operational amplifier AP1 is coupled to the first terminal of the switch S3. The second terminal of the switch S3 is coupled to the ground voltage end via the current supply CS3. The voltage VSS1 is supplied to the negative input terminal of the operational amplifier AP1, and the voltage VMG12 is supplied to the positive input terminal of the operational amplifier AP1. Then, the voltage VSS1o is output from the output terminal of the operational amplifier AP1.

3.2 Operations of Semiconductor Integrated Circuit

Next, the operations of the semiconductor integrated circuit 30 according to the third embodiment will be described. Here, the operation performed when the output voltage VOUT is switched from the voltage VIN12 to the voltage VIN5 will be discussed. In a manner similar to the first and second embodiments, the voltage VIN12 is higher than the voltage VIN5. The operation of switching the output voltage VOUT from the voltage VIN5 to the voltage VIN12 and other operations that are not mentioned here are the same as in the second embodiment.

Figure 10:
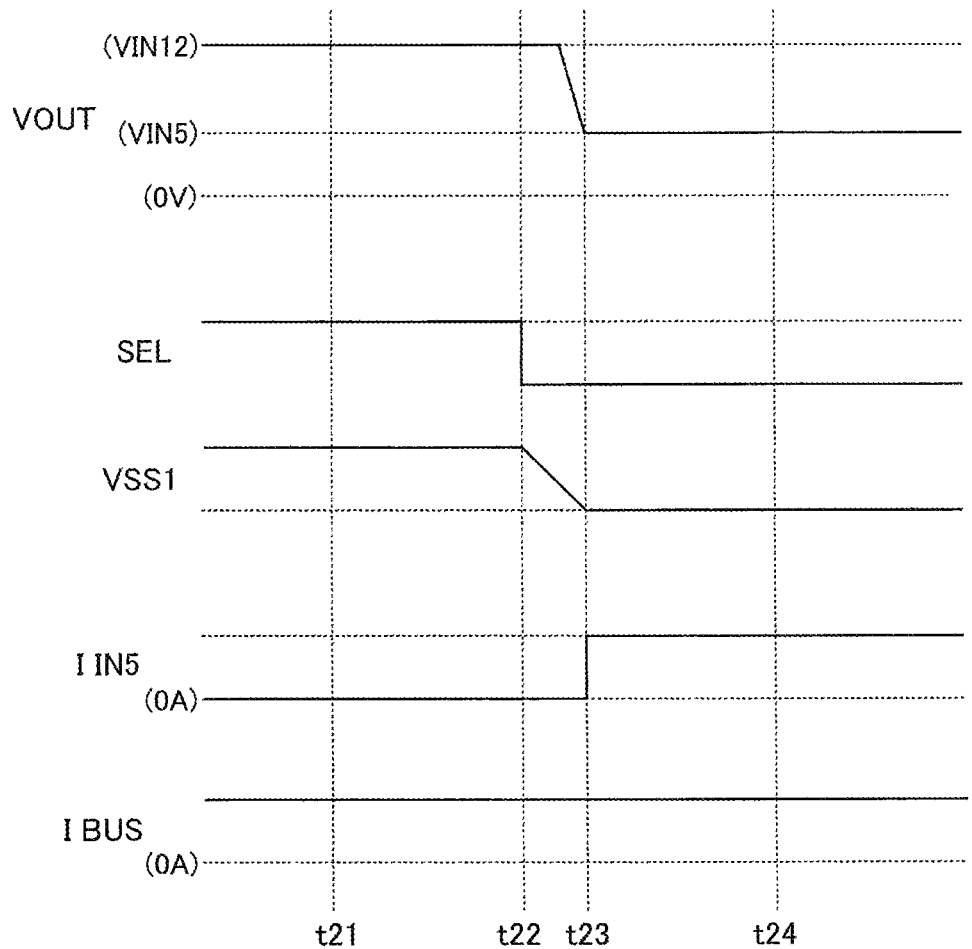
FIG. 10 is a timing chart showing the operations at the time of switching voltages in the semiconductor integrated circuit according to the third embodiment.

FIG. 10 is a timing chart showing the operations at the time of switching voltages in the semiconductor integrated circuit 30 according to the third embodiment.

When the voltage VIN12 is output as an output voltage VOUT, the switch signal SEL is set to "H", as shown at time t21. With the switch signal SEL at "H", the switch S3 turns to an unconnected state. With the current i supplied from the current supply CS4, charge is accumulated in the capacitor C1, and the voltage VSS1 is raised to the first voltage.

The voltage VSS1 is input to the negative input terminal of the operational amplifier AP1, and the voltage VMG12 is input to the positive input terminal of the operational amplifier AP1. At time t21, since the voltage VMG12 input to the positive input terminal is lower than the voltage VSS1, the voltage VSS1o output from the operational amplifier AP1 is at "L".

Since the voltage VSS1o output from the operational amplifier AP1 is at "L", the voltage VG12 maintains the level of the voltage that sets the switch circuit SW12 to the conduction state. As a result, the input voltage VIN12 is output as the output voltage VOUT. At time t21, an approximately 2-ampere current flows as the current IBUS, and no current flows as the current IIN5, where IBUS represents the current of the terminal TOUT from which the output voltage VOUT is output, and IIN5 represents the current of the input terminal TIN5 to which the input voltage VIN5 is supplied.

Next, at time t22, the switch signal SEL falls from "H" to "L", and the operation for switching the output voltage VOUT from the input voltage VIN12 to the input voltage VIN5 is initiated. When the switch signal SEL falls from "H" to "L", the switch S3 is switched from the unconnected state to the connected state. The charge accumulated in the capacitor C1 is thereby pulled down to the ground voltage end by the current supply CS3 with a current "2·i", which is two times larger than the current i. As a result, the voltage VSS1 at the negative input terminal of the operational amplifier AP1 falls with a constant gradient, shifted from the first voltage to the ground voltage.

When the voltage VSS1 falls with a certain constant gradient, the operational amplifier AP1 outputs a voltage that brings the voltage VMG12 and the voltage VSS1 to an equal level, as the voltage VSS1o. As a result, at time t23, the output voltage VOUT falls from the input voltage VIN12 to the input voltage VIN5 with a certain constant gradient. With the voltage VSS1 of the negative input terminal of the operational amplifier AP1 falling with the first gradient, the output voltage VOUT falls with the second gradient. In this manner, an undershoot, in which the output voltage VOUT temporarily decreases further than the voltage VIN5, can be suppressed. In this specification, an undershoot represents a phenomenon in which the output voltage VOUT temporarily decreases further than the targeted voltage VIN5.

Thereafter, at time t24, the voltage VIN5 is output as the output voltage VOUT.

3.3 Advantageous Effects of Third Embodiment

According to the third embodiment, a semiconductor integrated circuit capable of preventing a reverse current that tends to flow to the input power supply at the time of switching the input voltages can be provided. Furthermore, at the time of switching from the input voltage VIN12 to the input voltage VIN5, noise that tends to be produced in the output voltage VOUT can be reduced.

With the configuration of the third embodiment, the gradient of the fall of the output voltage VOUT from the input voltage VIN12 to the input voltage VIN5 can be controlled by setting the fall of the voltage VG12 to be supplied to the control terminal of the switch circuit SW12, to a certain constant gradient. In this manner, at the time of switching from the input voltage VIN12 to the input voltage VIN5, an undershoot can be prevented in the output voltage VOUT. Other effects of the present embodiment are the same as in the second embodiment.

4. Other Modification Examples

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalences are intended to cover such forms or modifications as would fall within the scope and spirit of the inventions.

What is claimed is:

1. A semiconductor integrated circuit comprising:
a first switch circuit configured to output or interrupt a first voltage in accordance with a first signal;
a second switch circuit configured to output or interrupt a second voltage in accordance with a second signal;
a correction circuit configured to correct the second signal and output a third signal; and
a comparison circuit configured to compare the third signal output from the correction circuit with the first voltage and determine the first signal based on a result of comparison.

2. The semiconductor integrated circuit according to claim 1, wherein
the second switch circuit includes a first n-channel MOS field effect transistor and a second n-channel MOS field effect transistor,
each of the first n-channel MOS field effect transistor and the second n-channel MOS field effect transistor has a first threshold voltage, and
the correction circuit outputs the third signal obtained by subtracting the first threshold voltage from the second signal.

3. The semiconductor integrated circuit according to claim 2, wherein
the correction circuit includes a third n-channel MOS field effect transistor, and
the third n-channel MOS field effect transistor has the first threshold voltage.

4. The semiconductor integrated circuit according to claim 1, wherein
the comparison circuit has a positive input terminal and a negative input terminal, and
the positive input terminal is supplied with the first voltage and the negative input terminal is supplied with the third signal.

5. The semiconductor integrated circuit according to claim 1, wherein
the comparison circuit has a positive input terminal and a negative input terminal, and
the positive input terminal is supplied with the third signal and the negative input terminal is supplied with the first voltage.

6. The semiconductor integrated circuit according to claim 5, further comprising:
a fourth n-channel MOS field effect transistor having a gate, a drain, and a source, wherein the gate is supplied with an output signal of the comparison circuit, the drain is supplied with the first signal, and the source is electrically coupled to a ground voltage end to which a ground voltage is supplied.

7. The semiconductor integrated circuit according to claim 1, wherein
the second switch circuit includes a first n-channel MOS field effect transistor and a second n-channel MOS field effect transistor, and
the semiconductor integrated circuit further comprises a driver electrically coupled to a gate of the first n-channel MOS field effect transistor and a gate of the second n-channel MOS field effect transistor.

8. The semiconductor integrated circuit according to claim 1, wherein
the first switch circuit includes a first n-channel MOS field effect transistor and a second n-channel MOS field effect transistor,
a drain of the first n-channel MOS field effect transistor is supplied with the first voltage,
a source of the first n-channel MOS field effect transistor is coupled to a source of the second n-channel MOS field effect transistor,
a drain of the second n-channel MOS field effect transistor is electrically coupled to an output terminal,
the second switch circuit includes a third n-channel MOS field effect transistor and a fourth n-channel MOS field effect transistor,
a drain of the third n-channel MOS field effect transistor is supplied with the second voltage,
a source of the third n-channel MOS field effect transistor is coupled to a source of the fourth n-channel MOS field effect transistor, and
a drain of the fourth n-channel MOS field effect transistor is electrically coupled to the output terminal.

9. A semiconductor integrated circuit comprising:
a first switch circuit configured to output or interrupt a first voltage in accordance with a first signal;
a second switch circuit configured to output or interrupt a second voltage in accordance with a second signal;
a first correction circuit configured to correct the first signal and output a third signal;
a second correction circuit configured to correct the second signal and output a fourth signal; and
a first circuit configured to determine the first signal and the second signal based on the third signal output from the first correction circuit, the fourth signal output from the second correction circuit, and an output voltage output from either one of the first switch circuit or the second switch circuit.

10. The semiconductor integrated circuit according to claim 9, further comprising:
a second circuit configured to determine a rate of a voltage change of the first signal.

11. The semiconductor integrated circuit according to claim 9, further comprising:
a third circuit configured to determine a rate of a voltage change of the second signal.

12. The semiconductor integrated circuit according to claim 9, wherein
the first correction circuit includes a first n-channel MOS field effect transistor,
the first signal is supplied to a gate and a drain of the first n-channel MOS field effect transistor, and the third signal is output from a source of the first n-channel MOS field effect transistor,
the second correction circuit includes a second n-channel MOS field effect transistor, and
the second signal is supplied to a gate and a drain of the second n-channel MOS field effect transistor, and the fourth signal is output from a source of the second n-channel MOS field effect transistor.

13. The semiconductor integrated circuit according to claim 9, further comprising:
a first n-channel MOS field effect transistor having a gate, a drain, and a source, wherein the gate is supplied with a fifth signal output from the first circuit, the drain is supplied with the first signal, and the source is electrically coupled to a ground voltage end to which a ground voltage is supplied; and a second n-channel MOS field effect transistor having a gate, a drain, and a source, wherein the gate is supplied with a sixth signal output from the first circuit, the drain is supplied with the second signal, and the source is electrically coupled to the ground voltage end.

14. The semiconductor integrated circuit according to claim 9, further comprising:

a first n-channel MOS field effect transistor having a gate, a drain, and a source, wherein the gate is supplied with a signal output from a second circuit, the drain is supplied with the first signal, and the source is electrically coupled to a ground voltage end; and a second n-channel MOS field effect transistor having a gate, a drain, and a source, wherein the gate is supplied with a signal output from a third circuit, the drain is supplied with the second signal, and the source is electrically coupled to the ground voltage end.

15. The semiconductor integrated circuit according to claim 9, further comprising:

a first charge pump configured to raise the first voltage and output the first signal; and a second charge pump configured to raise the second voltage and output the second signal.

16. The semiconductor integrated circuit according to claim 9, wherein the first switch circuit includes a first n-channel MOS field effect transistor and a second n-channel MOS field effect transistor, a drain of the first n-channel MOS field effect transistor is supplied with the first voltage, a source of the first n-channel MOS field effect transistor is coupled to a source of the second n-channel MOS field effect transistor, a drain of the second n-channel MOS field effect transistor is electrically coupled to an output terminal, the second switch circuit includes a third n-channel MOS field effect transistor and a fourth n-channel MOS field effect transistor, a drain of the third n-channel MOS field effect transistor is supplied with the second voltage, a source of the third n-channel MOS field effect transistor is coupled to a source of the fourth n-channel MOS field effect transistor, and a drain of the fourth n-channel MOS field effect transistor is electrically coupled to the output terminal.

* * * * *